(12) United States Patent
Otremba et al.

(10) Patent No.: US 8,853,849 B2
(45) Date of Patent: Oct. 7, 2014

(54) PACKAGE ARRANGEMENT AND A METHOD OF MANUFACTURING A PACKAGE ARRANGEMENT

(71) Applicant: Infineon Technologies Austria AG, Villach (AT)

(72) Inventors: Ralf Otremba, Kaufbeuren (DE); Josef Hoeglauer, Heimstetten (DE); Juergen Schredl, Mering (DE); Xaver Schloegel, Sachsenkam (DE); Klaus Schiess, Allensbach (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 13/786,525

(22) Filed: Mar. 6, 2013

(65) Prior Publication Data
US 2014/0252537 A1    Sep. 11, 2014

(51) Int. Cl.
*H01L 21/82* (2006.01)
*H01L 49/02* (2006.01)

(52) U.S. Cl.
CPC ............... *H01L 21/82* (2013.01); *H01L 28/00* (2013.01)
USPC ........... 257/698; 257/686; 257/777; 438/109; 438/126; 438/127

(58) Field of Classification Search
CPC ... H01L 23/48; H01L 23/481; H01L 23/3107; H01L 23/3114; H01L 23/488; H01L 21/48; H01L 21/4885; H01L 21/50; H01L 21/56

USPC ........... 257/686, 698, 777; 438/109, 126, 127
See application file for complete search history.

(56) References Cited

U.S. PATENT DOCUMENTS

| | | | | |
|---|---|---|---|---|
| 5,498,902 | A | * | 3/1996 | Hara .............................. 257/686 |
| 5,608,265 | A | * | 3/1997 | Kitano et al. ................. 257/738 |
| 5,973,393 | A | * | 10/1999 | Chia et al. ..................... 257/690 |
| 7,851,894 | B1 | * | 12/2010 | Scanlan ......................... 257/659 |
| 7,969,018 | B2 | | 6/2011 | Otremba et al. |
| 2003/0164543 | A1 | * | 9/2003 | Kheng Lee ................... 257/706 |
| 2008/0017907 | A1 | | 1/2008 | Otremba |
| 2008/0284045 | A1 | * | 11/2008 | Gerber et al. ................. 257/778 |
| 2009/0045446 | A1 | | 2/2009 | Otremba |
| 2010/0289135 | A1 | | 11/2010 | Otremba et al. |
| 2011/0215460 | A1 | | 9/2011 | Otremba et al. |
| 2011/0244634 | A1 | * | 10/2011 | Kim et al. ..................... 438/124 |

FOREIGN PATENT DOCUMENTS

| | | |
|---|---|---|
| DE | 102004023307 B3 | 10/2005 |
| DE | 102010016798 A1 | 11/2010 |

OTHER PUBLICATIONS

International Rectifier; Integrated Power Module for Small Appliance Motor Drive Applications; Feb. 3, 2013; pp. 1-19.

\* cited by examiner

Primary Examiner — Peniel M Gumedzoe

(57) ABSTRACT

In various embodiments, a package arrangement is provided. The package arrangement may include a first package. The package arrangement may further include a through hole package including at least one contact terminal. The first package may include at least one hole in an encapsulant to receive the at least one contact terminal of the through hole package. The received at least one contact terminal may provide a solder contact.

15 Claims, 14 Drawing Sheets

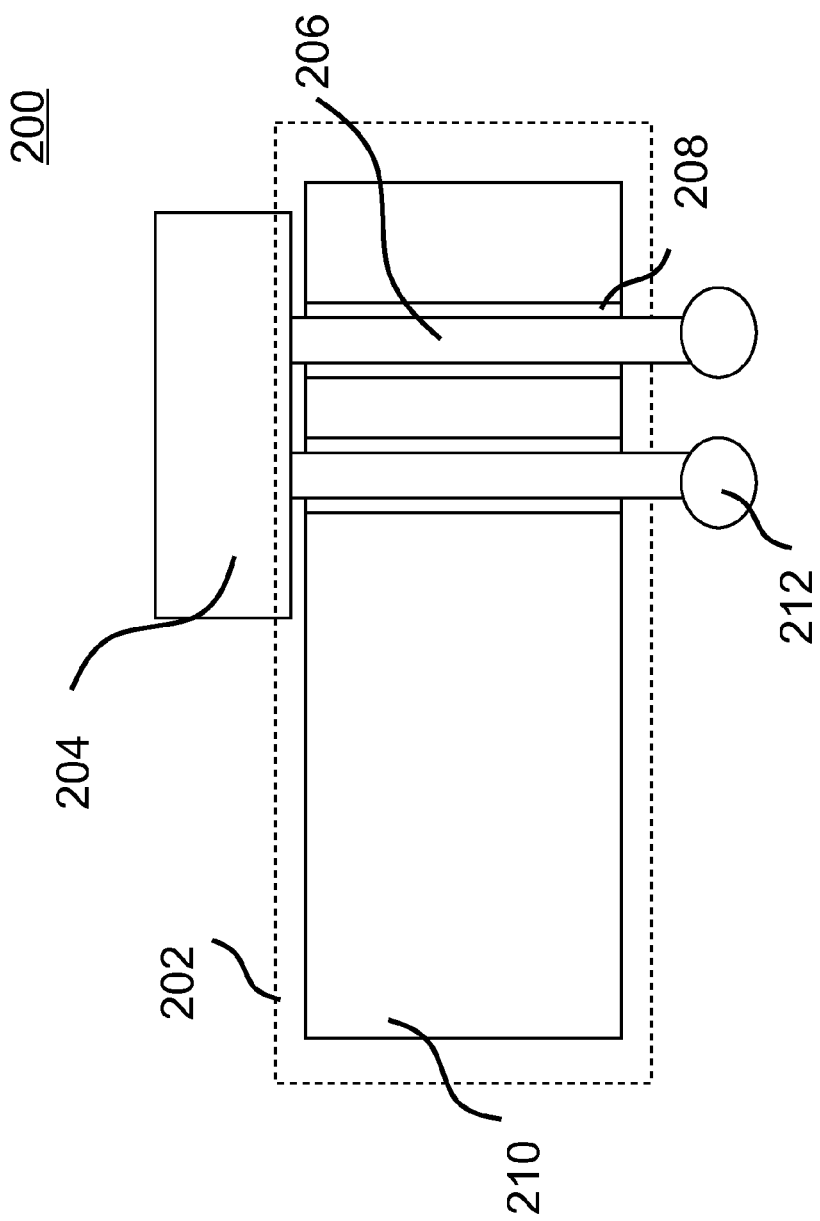

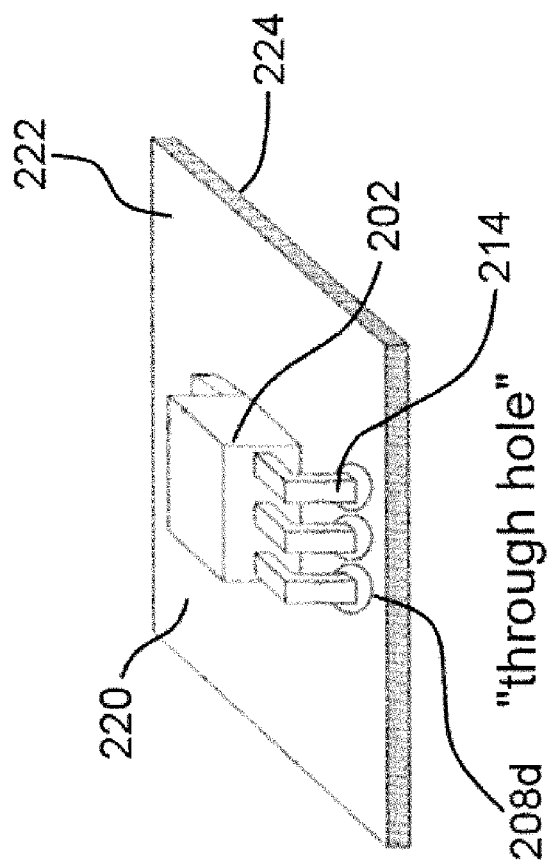

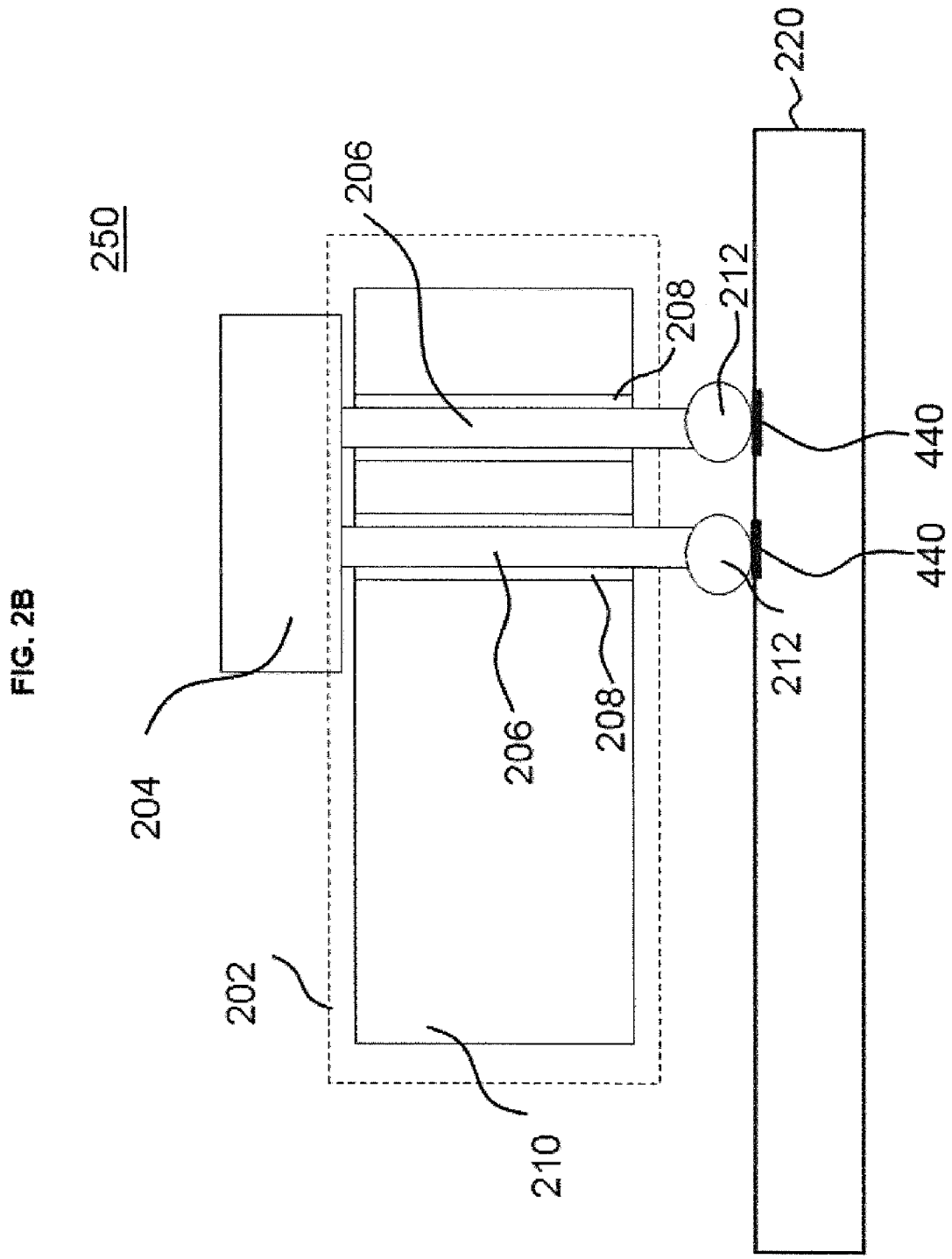

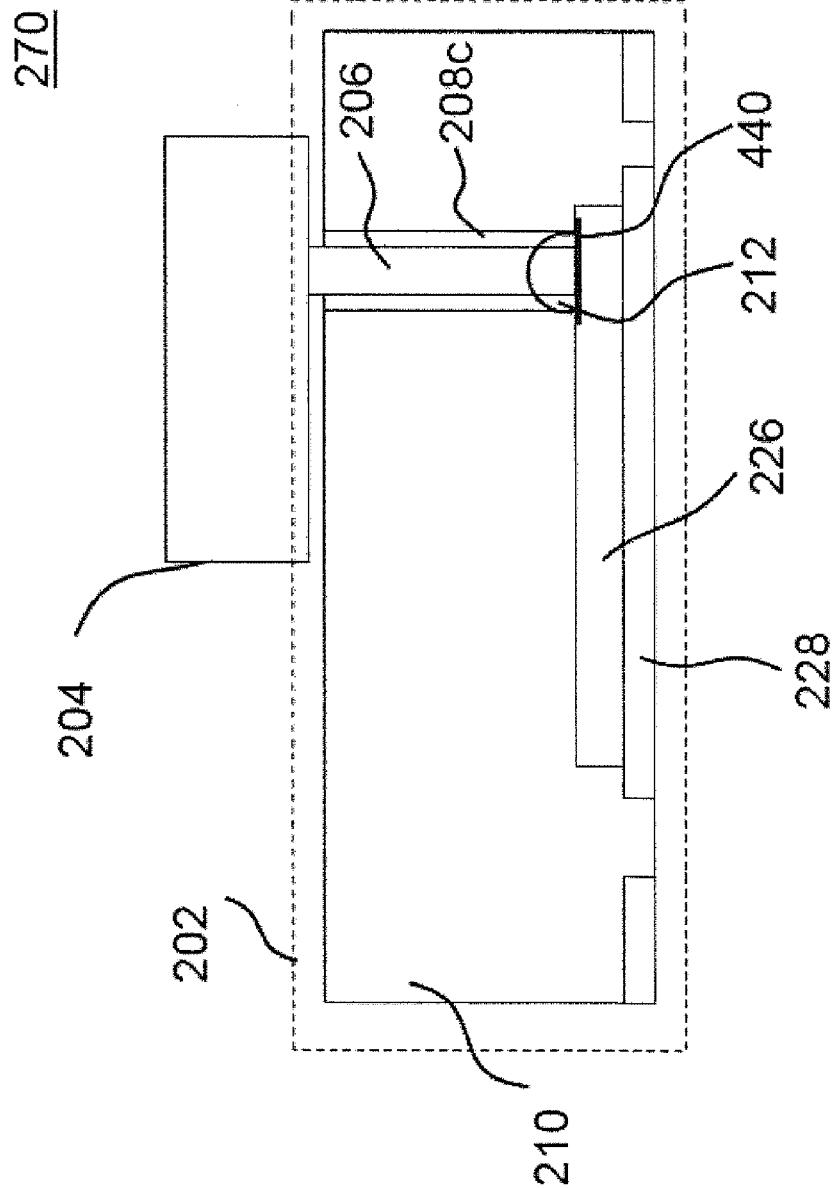

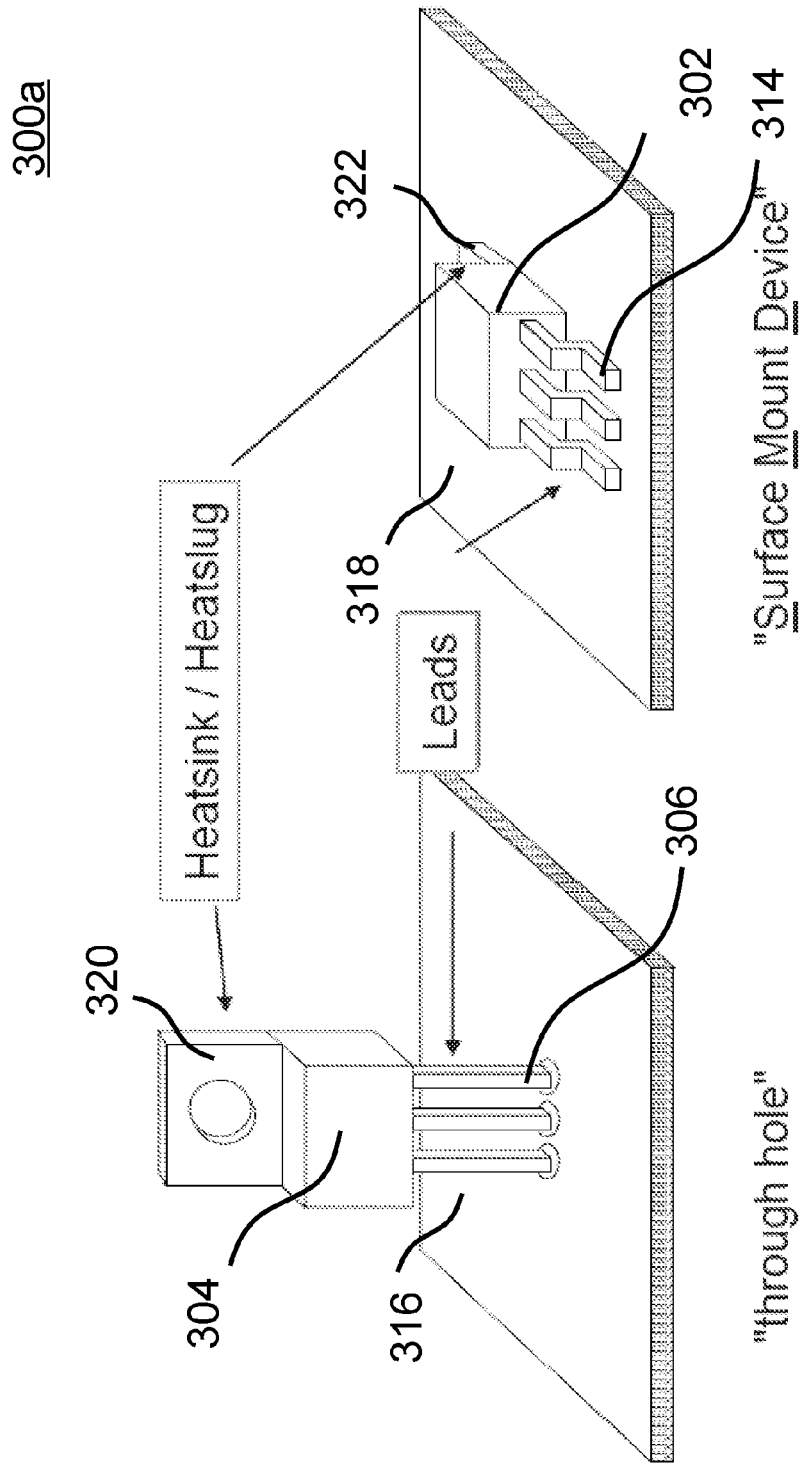

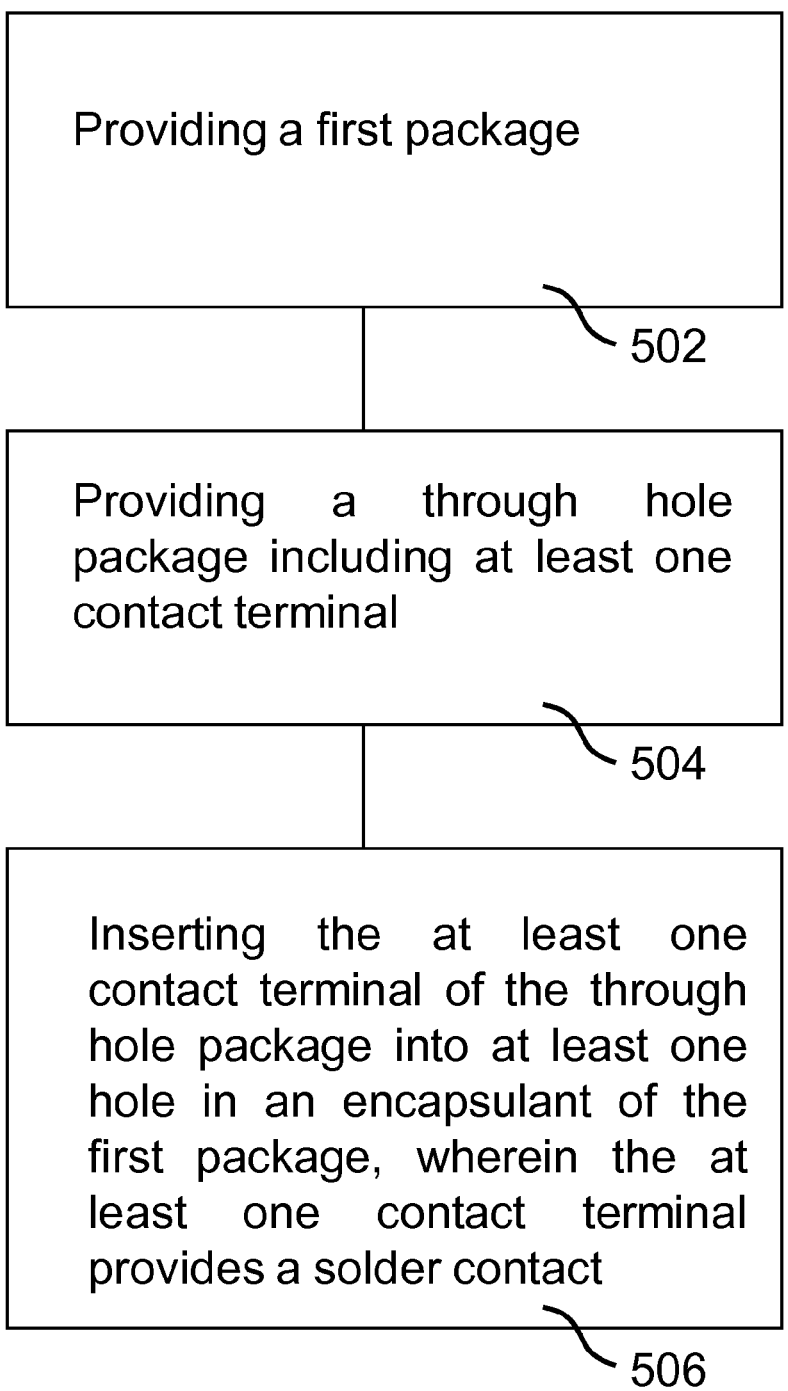

PACKAGE ARRANGEMENT AND A METHOD OF MANUFACTURING A PACKAGE ARRANGEMENT

TECHNICAL FIELD

Various embodiments relate generally to a package arrangement and a method of manufacturing a package arrangement.

BACKGROUND

FIG. 1 shows an image 100 of a power supply. The power supply may make use of passive components 102 such as capacitors and active components 104 such as power integrated circuits.

In some semiconductor packaging, the active components (e.g. power integrated circuits) and/or passive components (e.g. resistors, capacitors and inductors) are stacked on one another and connected to a circuit board using surface mount technology (SMT).

However, the space that can be saved by these stack arrangements is still limited by the size of the bigger components and the surface mounting contacts. The design of these packages may be still constrained by the bigger components and the surface mounting contacts.

SUMMARY

In various embodiments, a package arrangement is provided. The package arrangement may include a first package. The package arrangement may further include a through hole package including at least one contact terminal. The first package may include at least one hole in an encapsulant to receive the at least one contact terminal of the through hole package. The received at least one contact terminal may provide a solder contact.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 2 shows a cross-sectional side view of a package arrangement according to various embodiments; FIG. 2A shows a front left perspective view of a through hole package according to various embodiments; FIG. 2B shows a cross-sectional side view of a package arrangement according to various embodiments; FIG. 2C shows a cross-sectional side view of a package arrangement according to various embodiments.

FIG. 3A shows a front left perspective view of surface mount device package according to various embodiments and a through hole package according to various embodiments while

FIG. 5 shows a method to manufacture a package arrangement according to various embodiments.

DESCRIPTION

Figure 1:
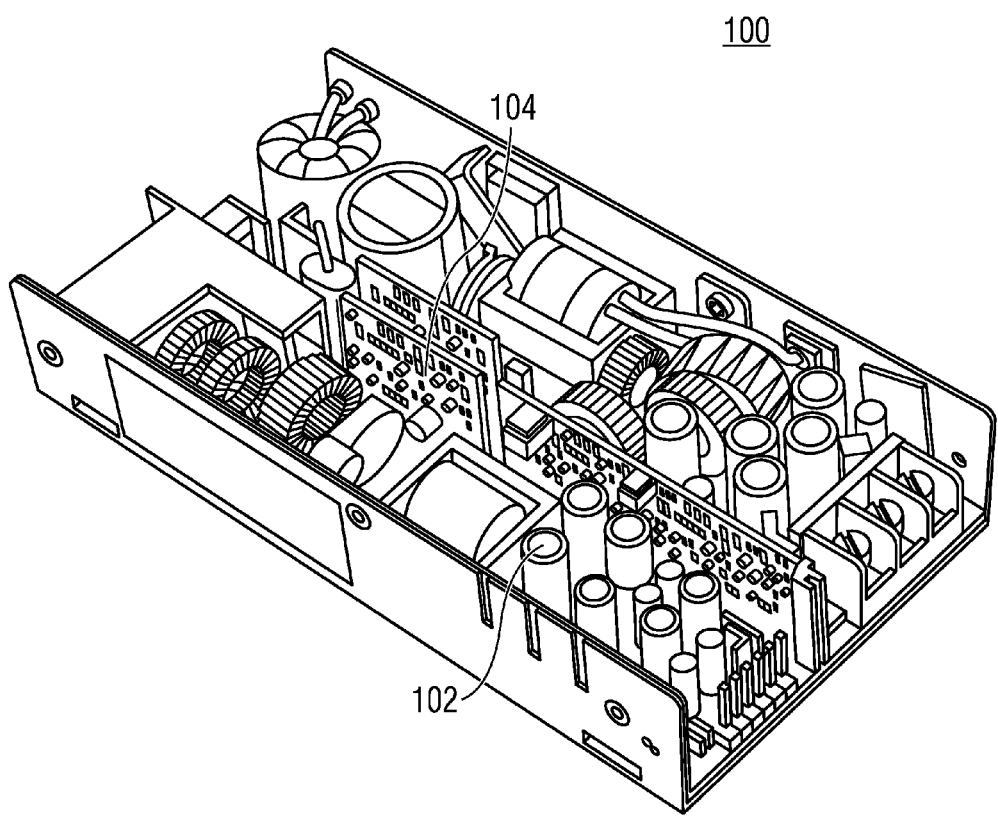
FIG. 1 shows a power supply.

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

It should be understood that the terms "top", "bottom", "front", "back", "side", "left", "right", "base", "down", "sideways", "downwards" etc., when used in the following description are used for convenience and to aid understanding of relative positions or directions, and not intended to limit the orientation of the package arrangement or the packages making up the package arrangement.

Various embodiments provide a package arrangement which addresses at least partially some of the abovementioned challenges.

FIG. 2 shows a schematic 200 having a cross-sectional side view of a package arrangement according to various embodiments. The package arrangement may include a first package 202. The package arrangement may further include a through hole package 204 including at least one contact terminal 206. The first package 202 may include at least one hole 208 in an encapsulant 210 to receive the at least one contact terminal 206 of the through hole package 204. The received at least one contact terminal 206 may provide a solder contact 212.

In other words, a through hole package 204 having at least one contact terminal 206 may be provided. In addition, a first package 202 may be provided. The first package 202 may include at least one hole 208 in an encapsulant 210. The through hole package 204 and the first package 202 may be arranged such that the contact terminal 212 may be received in the at least one hole 208. The received at least one contact terminal 206 may provide a solder contact 212.

Various embodiments provide a package arrangement which may save on footprint as the at least one contact terminal 206 of the through hole package 204 is received in the at least one hole 208.

The through hole package 204 may be on the first package 202. Alternatively, the through hole package 204 may be over the first package 202. Area savings may be achieved as the through hole package 204 may be arranged on or over the first package 202 and the at least one contact terminal 206 of the through hole package may be received by at least one hole 208. The through hole package 204 and the first package 202 may form a stacked arrangement.

The through hole package 204 may be separated from the first package 202 by one or more intermediate layers or a substrate or a carrier. The one or more intermediate layers or the substrate or the carrier may have through holes to allow the at least one contact terminal 206 to pass through the substrate or carrier to the first package 202.

In various embodiments, the first package 202 may include a surface mount package. The first package 202 may be mounted onto a surface of a substrate (e.g. a printed circuit board (PCB)). The first package 202 may be soldered to the surface.

In various other embodiments, the first package 202 may include a through hole package. The first package 202 may include a through hole package 202 with bent pins 214, as shown in FIG. 2A. The bent pins 214 may be configured for insertion into holes 208d on a first surface 222 of a substrate 220 (e.g. a printed circuit board (PCB)). The holes 208d may extend to a second surface 224 of the substrate 220 opposite the first surface 222. The pins 214 may pass through the holes 208d to the second surface 224. The pins 214 may be soldered to electrically conductive pads. The pins 214 may be electrically conductive. The pins 214 may be configured to securely attach the first package 202 to the substrate 220.

Referring again to FIG. 2, the solder contact 212 may include a solder connection, e.g. implemented by one or more solder balls and/or one or more solder bumps. In various embodiments, the solder contact 212 may include one or more of a group of elements including tin (Sn), lead (Pb), silver (Ag) or copper (Cu). The solder contact 212 may be formed by melting the solder using an elevated temperature, applying the liquefied solder to the at least one contact terminal 206 using a solder gun or any other suitable means and allowing the liquefied solder to solidify to form the solder contact 212. The solder contact 212 may be positioned anywhere along the contact terminal 206. The solder contact 212 may be near the tip of the contact terminal 206 for connecting with a substrate such as a printed circuit board. The solder contact 212 may be positioned within the at least one hole 208 such that when the at least one contact terminal 206 is received in at least one hole 208 which exposes the contact, the solder contact 212 may electrically couple a contact (of for instance, a chip, a carrier or a further chip) to the at least one contact terminal 206. The solder contact 212 may securely connect the contact terminal 206 to another structure such as a contact. For example, FIG. 2B shows sectional view 250 of a package arrangement according to various embodiments including a board contact 440 of a printed circuit board 220 coupled to the at least one contact terminal 206 via the solder contact 212, as described further below.

Referring to FIG. 2C, which shows a sectional view 270 of a package arrangement according to various embodiments, the first package 202 may include at least one chip 226 and a contact 440. The contact 440 may include an electrical contact. The at least one chip 226 may be on a metallic carrier 228. In various embodiments, the at least one chip 226 may include the contact 440. In other words, the contact 440 may be a chip contact. Alternatively, the contact may be on the metallic carrier (e.g. a leadframe) in which the at least one chip is on. The solder contact 212 may be provided between the at least one contact terminal 206 and the contact 440. By way of example, the at least one chip 226 is or includes an application specific integrated circuit (ASIC) chip or a field programmable gate array (FPGA). In various embodiments, the at least one chip 226 may be or include a hard wired logic chip and/or a programmable logic chip (such as e.g. a programmable processor, e.g. a programmable microprocessor or the like).

The encapsulant 210 may include a mold compound. The at least one or more chips (and/or carrier) may be embedded in the encapsulant 210 using a film assisted molding process. The at least one or more chips (and/or carrier) may be at least be partially covered by the encapsulant.

In various embodiments, the package arrangement may further include a printed circuit board (PCB). As shown in FIG. 2B, the first package 202 may be mounted on the printed circuit board 220. The printed circuit board (PCB) 220 may include a board contact 440. The solder contact 212 may be provided between the at least one contact terminal 206 and the board contact 440. In other words, the solder contact 212 may electrically couple the at least one contact terminal 206 to the board contact 440. The board contact 440 may be configured for electrical coupling to an external device or component.

The first package 202 may include at least one chip and a contact (see e.g., FIG. 2C). The contact may include an electrical contact. The at least one chip 202 may include the contact. In other words, the contact may be a chip contact. Alternatively, the contact may be part of a metallic carrier (e.g. a leadframe) in which the at least one chip is on. The printed circuit board may be configured to electrically couple the contact to the solder contact 212. The through hole package 204 may also have at least one further chip. The further chip (of the through hole package 204) may be electrically coupled to the chip (of the first package 202) via the printed circuit board and the at least one contact terminal 206. The printed circuit board may include metallization or electrically conductive traces (e.g. metal trace) configured to electrically couple the further chip or (of the through hole package 204) to the chip (of the first package 202). In other words, there may be a chip-board-chip electrical connection. The chip may include an electrical component. Correspondingly, the further chip may also include an electrical component between the first package and the through hole package.

The at least one hole 208 may expose the contact to electrically couple to the at least one contact terminal 206 of the through hole package 204. The through hole package 204 may also have at least one further chip. The further chip (of the through hole package 204) may be electrically coupled to the chip (of the first package 202) via the contact and contact terminal 206. In other words, there may be a chip-chip electrical connection between the first package and the through hole package.

In various embodiments, the at least one hole 208 in the encapsulant 210 may be a through hole extending from a first main side of the first package 202 to a second main side of the first package 202 opposite the first main side. The at least one contact terminal 206 of the through hole package 204 may extend through the entire through hole from the first main side of the first package 202 to the second main side of the first package 202. The at least one contact terminal 206 may project from the second main side of the first package 202. In various embodiments, the solder contact 212 may be provided on a portion of the at least one contact terminal 206 that projects from the second main surface of the first package 202.

In various embodiments, the at least one hole in the encapsulant 210 may include a series of vias. The series of vias may include conductive material. The series of vias may be electrically coupled to one another either directly or indirectly via metallization within the encapsulant 210. The package arrangement may be configured such that the contact terminal 206 when received in the at least one hole 208 is in contact with at least a portion of the conductive material. The conductive material may electrically couple the contact terminal 206 from the first main surface of the first package 202 to the second main surface of the first package 202 opposite the first main surface.

The first package 202 may include an active device. The active device may be or may include an integrated circuit such as a logic integrated circuit, a memory integrated circuit or a power integrated circuit. The integrated circuit may be an application specific integrated circuit (ASIC) or a field programmable gate array (FPGA). As an alternative, the integrated circuit may be any other programmable logic circuit such as e.g. a programmable processor, e.g. a programmable microprocessor or programmable nanoprocessor. The first package 202 may include at least one chip which is or which includes the active device. The first package 202 may include additional active devices or passive devices. The additional devices or passive devices may be electrically coupled to the active device. The additional devices or passive devices may be electrically coupled to the active device using electrical connections such as interconnects, metallization or wire bonds. An active device may include at least one active component. A passive device may include at least one passive component.

The through hole package 204 may include a passive device. The passive device may be or may include a capacitor, an inductor, a diode or a resistor. The through hole package 204 may include an active device. The active device may be or may include an integrated circuit such as a logic integrated circuit, a memory integrated circuit or a power integrated circuit. The integrated circuit may be art application specific integrated circuit (ASIC) or a field programmable gate array (FPGA). The through hole package 204 may also include additional active devices or passive devices.

In various embodiments, the active and/or passive device(s) in the through hole package 204 may be configured to work with the active device(s) in the first package 202 to perform a function. The device(s) in the through hole package 202 and the device(s) in the first package 202 may be different modules configured to work with one another. For instance, the through hole package 204 may include a capacitor to store a logic state while the first package 202 may include a logic circuit to read and write the logic state stored in the capacitor. In another instance, the through hole package 204 may include a filter and the first package 202 may include a low noise amplifier configured to work with the filter.

In various other embodiments, the active and/or passive device(s) in the through hole package 204 may be electrically independent from the active device(s) in the first package 202.

In various embodiments, a passive device may include entirely of passive components. On the other hand, an active device may include at least one active component. A passive component may be a component that is by itself, incapable of power gain. In contrast, an active component may be a component that is by itself, capable of power gain. Passive components may include capacitors, inductors, resistors, diodes etc. Active components may include transistors, e.g. logic transistors or power transistors (e.g. power metal oxide field effect transistors (power MOSFETs), or power bipolar transistors, or insulated gate bipolar transistors (IGBTs), vacuum tubes, relays, tunnel diodes or glow tubes.

In various embodiments, a sleeve may be provided in the at least one hole 208 of the first package. The sleeve may be configured to strengthen the received at least one contact terminal 206 in the at least one hole 208. In other words, the sleeve may be configured to improve the mechanical strength of the received at least one contact terminal 206. The sleeve may be electrically conductive. In various embodiments, the sleeve may be electrically coupled to the at least one contact terminal 206 via the solder contact 212. The sleeve may be soldered to the at least one contact terminal 206 using the solder contact 212. The sleeve may include metal or metal alloys.

In various embodiments, more than one through hole packages 204 may be arranged on or over the first package 202. The plurality of through hole packages 204 may be configured to work with the first package 202. One or more of the through hole packages 204 may be electrically coupled to the first package 202. Two or more of the through hole packages 204 may be electrically coupled to one another. Metallization may be formed on the encapsulant of the first package 202 to electrically couple the two or more through hole packages.

The through hole package may also include encapsulant material. The encapsulant material may at least cover partially a chip or a device or a chip carrier in the through hole package.

FIG. 3A is a schematic 300a showing a front left perspective view of surface mount device package 302 according to various embodiments and a through hole package 304 according to various embodiments. The through hole package 304 may include at least one contact terminal 306. The at least one contact terminal 306 may be electrically conductive. The at least one contact terminal 306 may include straight pins or bent pins. A solder contact may be provided on the at least one contact terminal 306. The through hole package 304 may be configured to be mounted onto a substrate 316. The at least one contact terminal 306 may be configured to be electrically coupled to electrical contacts or metallizations or conductive pads on the substrate 316. The through hole package 304 may further include a heat sink 320.

The surface mount package 302 may include at least one contact terminal 314. The at least one contact terminal 314 may be electrically conductive. The at least one contact terminal 314 may include bent pins or bent leads or conductive pads. A solder contact may be provided on the bent pins or bent leads or conductive pads. The surface mount package 302 may be configured to be mounted onto a substrate 318. The at least one contact terminal 314 may be configured to be electrically coupled to electrical contacts or metallizations or conductive pads on the substrate 318. The surface mount package 302 may further include a heat sink 322.

In various embodiments, the first package may be or may include the surface mount device package 302 or the through hole package 304. The first package may further include one hole in the encapsulant (at least partially encpasulating the surface mount device package 302 or the through hole package 304). In various embodiments, the package arrangement may further include a through hole package 304 arranged on or over the first package.

Figure 3B:
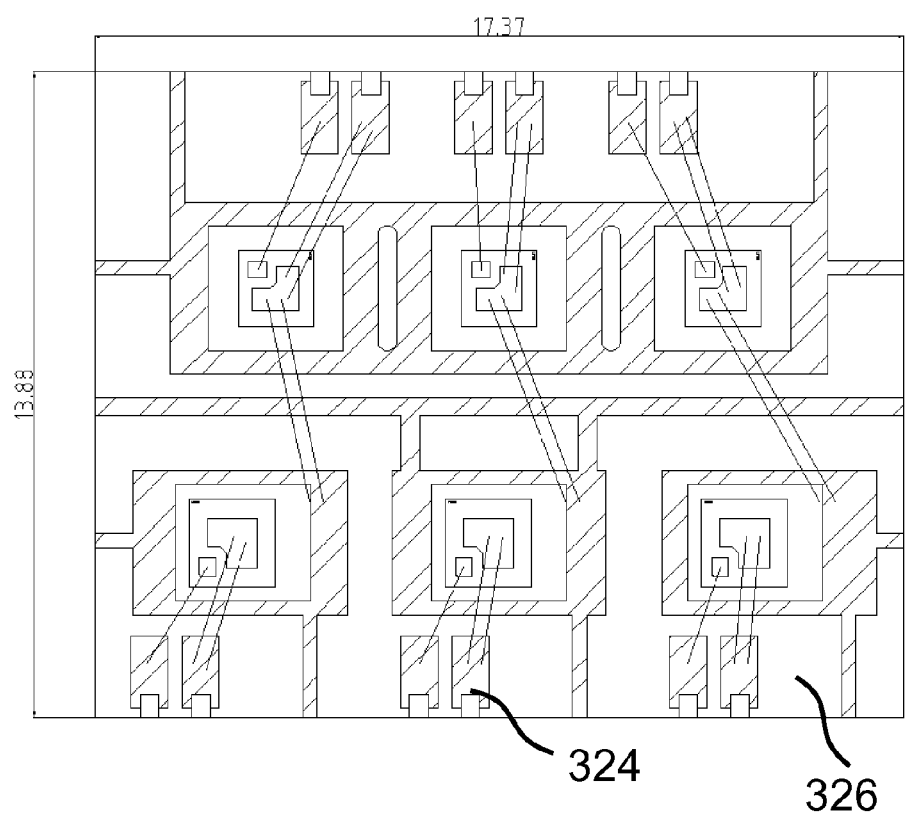
FIG. 3B shows a top planar view of a first package according to various embodiments.

FIG. 3B is a schematic 300b showing a top planar view of a first package according to various embodiments. The package arrangement may be configured for high voltage applications. The first package may include an active device such as a power integrated circuit. The first package may include used areas 324, which includes areas used for chips, contacts, metallizations etc. The first package may also include unused areas 326. The unused areas may be space without any electrical components or circuitry, i.e. areas without internal functions. The unused areas may be space configured to separate the various components in the first package. The unused areas may include at least one through hole.

Various embodiments may be suitable for high voltage applications, such as applications for voltage exceeding about 200V. High voltage applications may require large footprint with large unused spaces between components to separate the components. The unused spaces may be utilized for forming at least one hole such that the at least one contact terminal of the through hole package may be received in the at least one hole. Various embodiments may lead to reduction in footprint as the through hole packages are mounted on or over the first package.

Figure 4A:
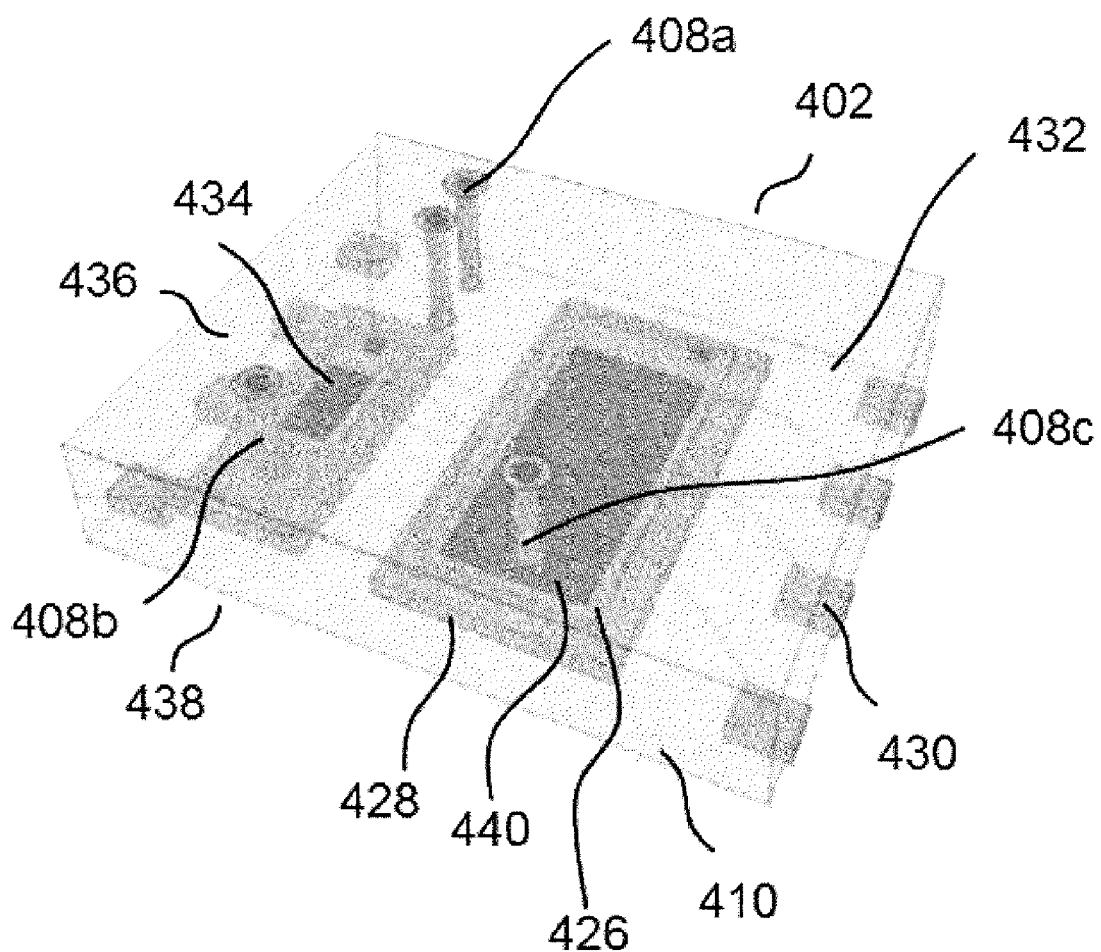
FIG. 4A shows a top left front perspective inside view of a first package according to various embodiments.
Figure 4B:
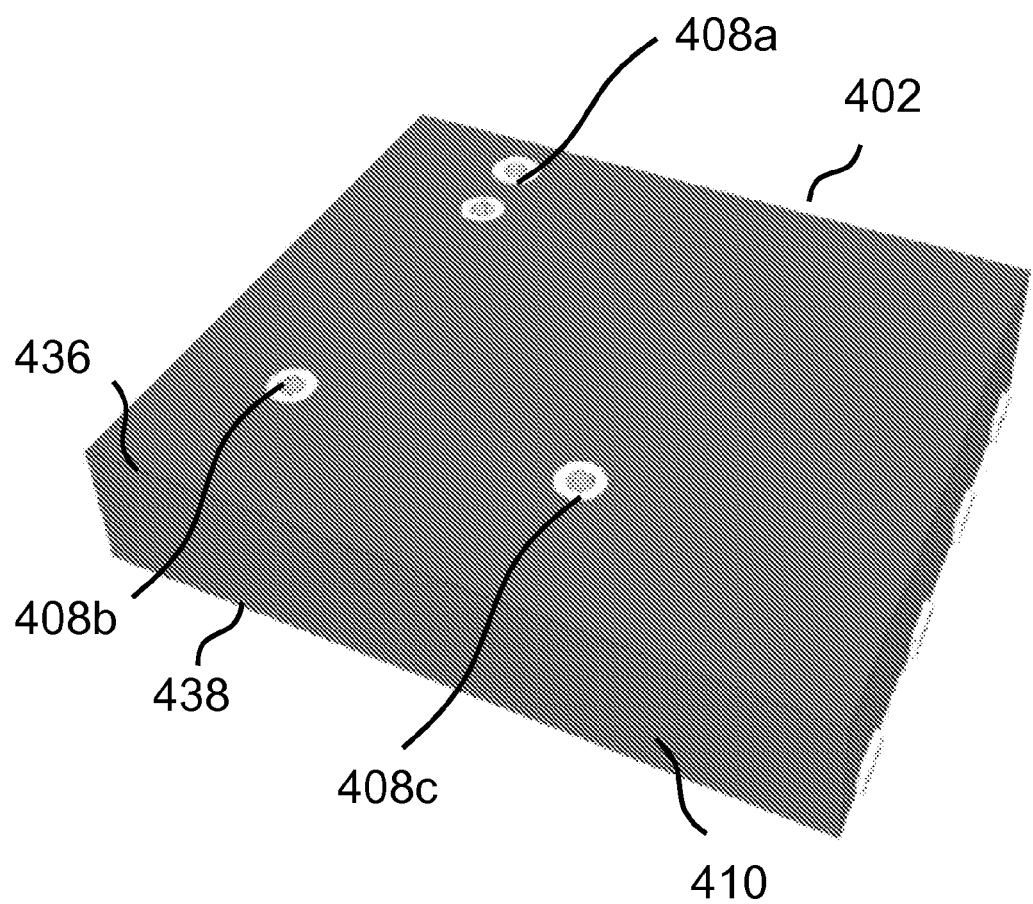
FIG. 4B shows a top left front perspective outside view of the first package shown in FIG. 4A according to various embodiments.
Figure 4C:
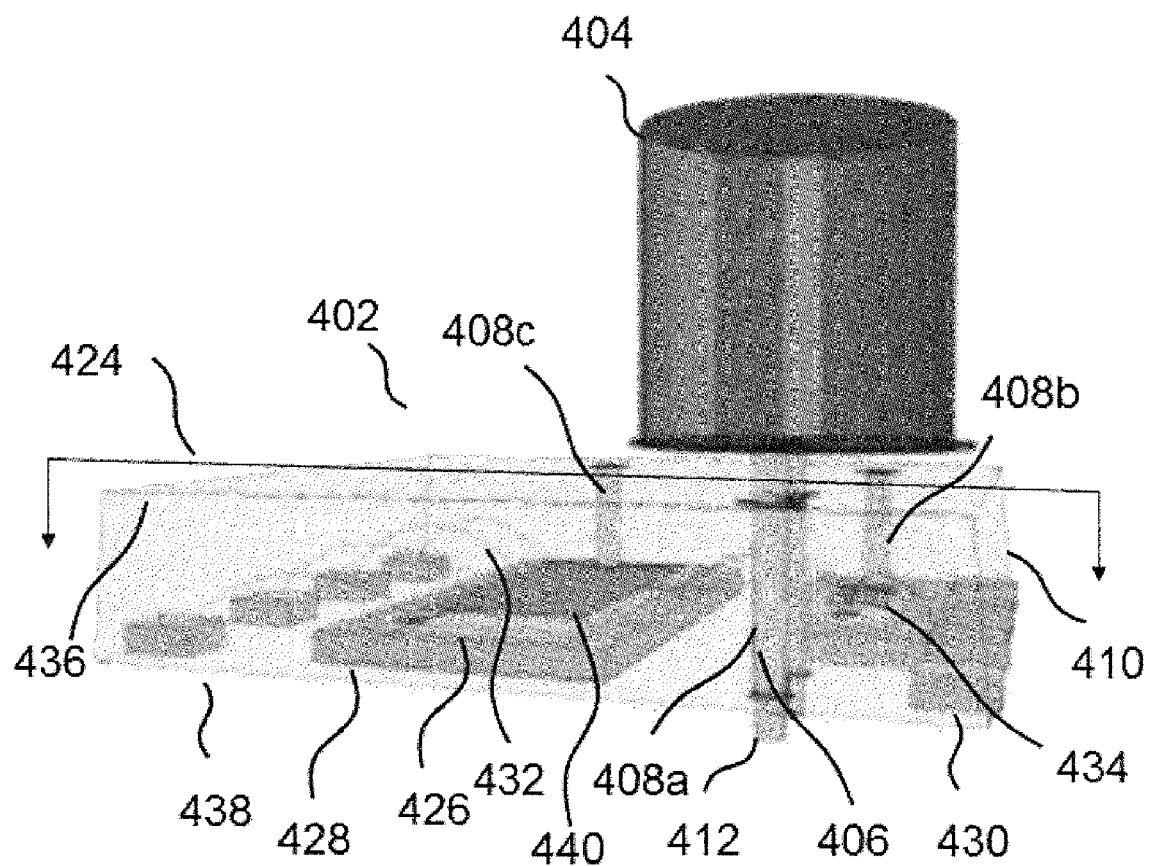
FIG. 4C shows a right back perspective inside view of a package arrangement according to various embodiments including the first package illustrated in FIG. 4A.
Figure 4D:
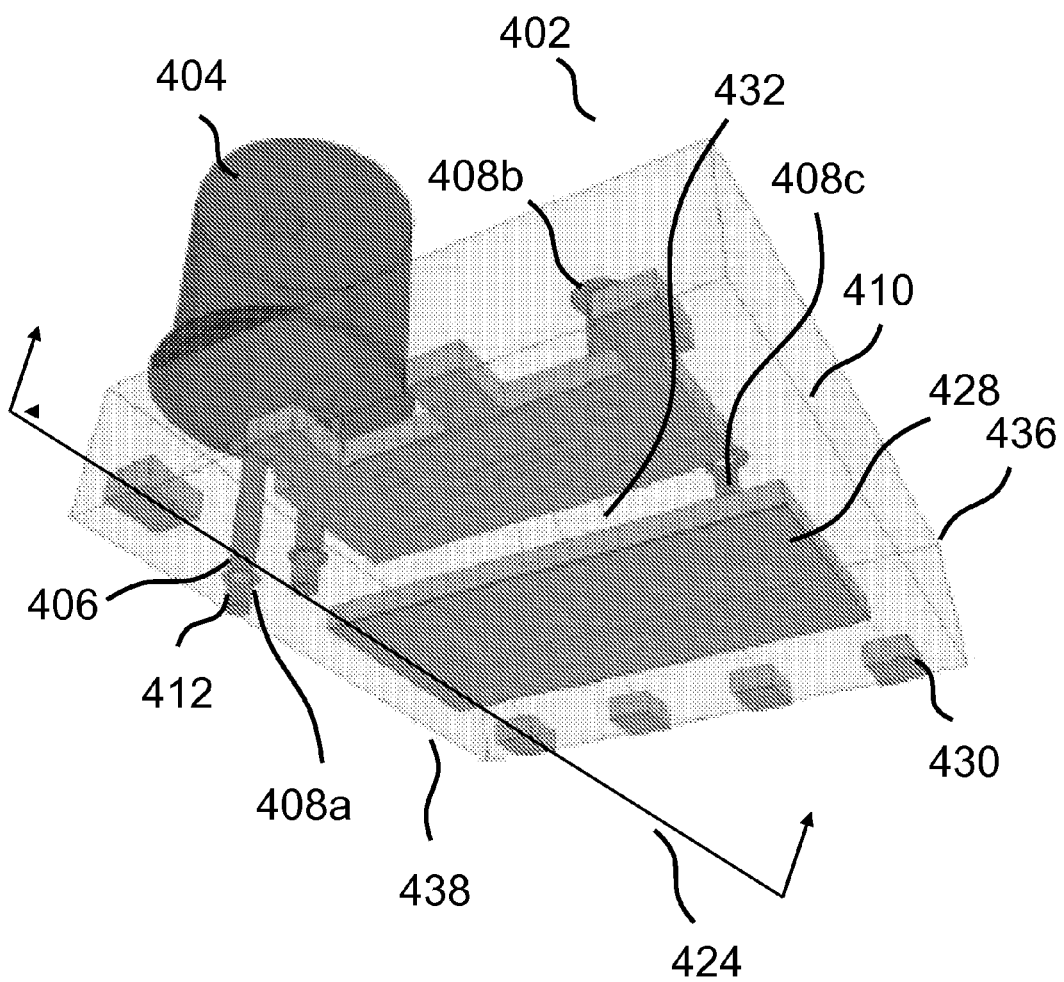
FIG. 4D shows a bottom front right perspective inside view of the package arrangement shown in FIG. 4C according to various embodiments.
Figure 4E:
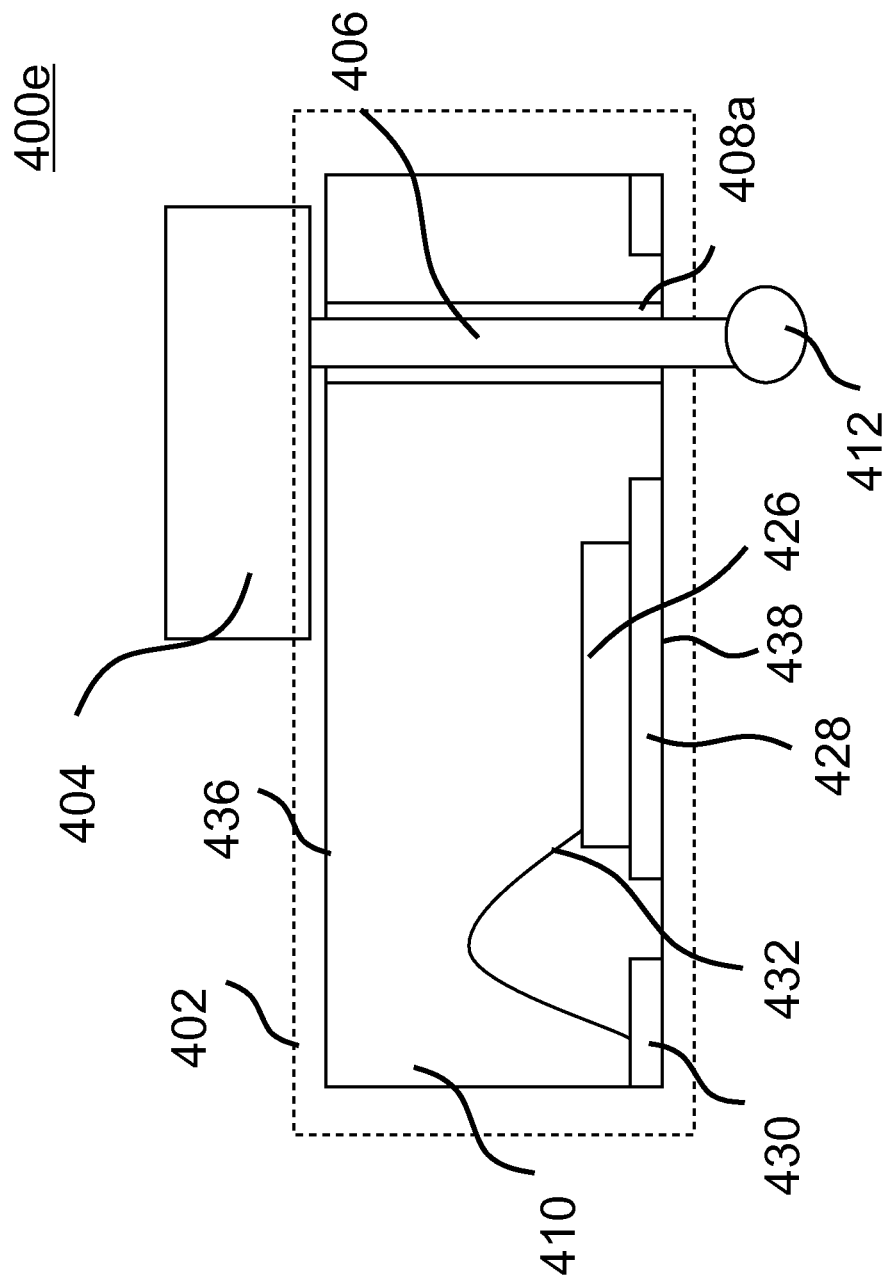
FIG. 4E shows a cross sectional view of the package arrangement across the plane 424 as illustrated in FIG. 4C and FIG. 4D according to various embodiments.
Figure 4F:
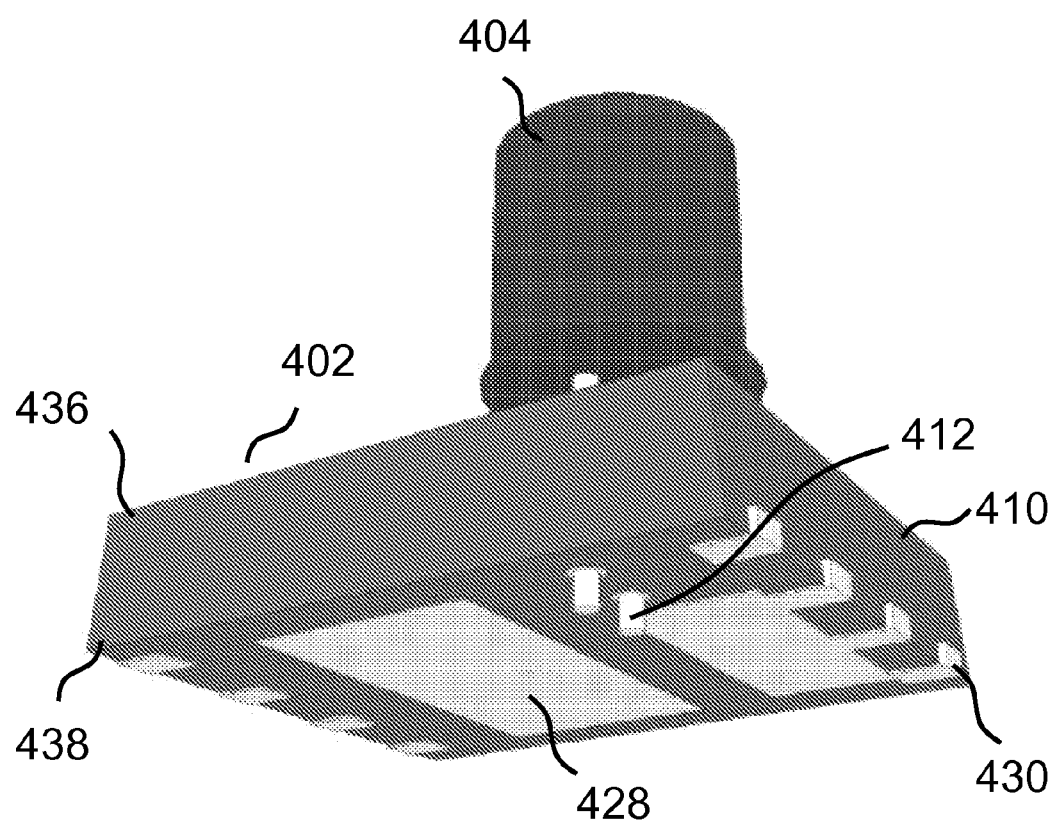
FIG. 4F shows a bottom right back view perspective outside view of the package arrangement as shown in FIG. 4C according to various embodiments.

FIG. 4A is a schematic 400a showing a top left front perspective inside view of a first package according to various embodiments. FIG. 4B is a schematic 400b showing a top left front perspective outside view of the first package shown in FIG. 4A according to various embodiments, FIG. 4C is a schematic 400c showing a right back perspective inside view of a package arrangement according to various embodiments including the first package illustrated in FIG. 4A. FIG. 4D is a schematic 400d showing a bottom front right perspective inside view of the package arrangement shown in FIG. 4C according to various embodiments. FIG. 4E is a schematic 400e showing a cross sectional view of the package arrangement across the plane 424 as illustrated in FIG. 4C and FIG. 4D according to various embodiments. FIG. 4F is a schematic 400f showing a bottom right back view perspective outside view of the package arrangement as shown in FIG. 4C according to various embodiments.

The package arrangement may include a first package 402. The first package 402 may include at least one hole 408a, 408b, 408c in an encapsulant 410. The first package 402 may further include a chip 426. The encapsulant 410 may at least partially cover the chip 426. The chip 426 may be mounted on a metallic carrier 428 such as a leadframe. The encapsulant 410 may at least partially cover the metallic carrier 428. The first package 402 may also include one or more contacts 430 on the metallic carrier. The contacts 430 may be electrically coupled to the chip 426 by one or more coupling methods. For instance, a contact 430 may be electrically coupled to the chip 426 by wire bonds 432. Alternatively, the contact 430 may be electrically coupled to the chip 426 via the carrier 428 or interconnects embedded in the encapsulant 410. The carrier 428 may include metallization for electrical coupling between the chip 426 and a contact 430. A plurality of contacts 430 may be electrically coupled to the chip 426 by a combination of coupling methods. The one or more contacts 430 may be exposed on at least one side of the first package 402. Further, the one or more contacts 430 may be configured to be electrically coupled to an external device or component such as a printed circuit board.

The first package 402 may also include a subsequent chip 434. The further chip 434 may be electrically coupled to the chip 426 via wire bonds 432. Alternatively, the subsequent chip 434 may be electrically coupled to the chip 426 via the carrier 428 or interconnects embedded in the encapsulant 410. The carrier 428 may include metallization for electrical coupling between the chip 426 and the subsequent chip 434. The subsequent chip 434 may also be electrically coupled to the contacts 430 by a coupling method. For instance, a contact 430 may be electrically coupled to the subsequent chip 434 by wire bonds 432. Alternatively, the contact 430 may be electrically coupled to the subsequent chip 434 via the carrier 428 or interconnects embedded in the encapsulant 410. The carrier 428 may include metallization for electrical coupling between the subsequent chip 434 and the contact 430. A plurality of contacts 430 may be electrically coupled to the subsequent chip 434 by a combination of coupling methods.

The chip 426 may include an active device. The subsequent chip 434 may include another active device or a passive device.

As shown in FIGS. 4A to 4F, the first package 402 may be a surface mount package. Alternatively, the first package 402 may be a through hole package. The first package 402 may have bent pins.

The at least one hole 408a may be a through hole extending from a first main surface 436 of the first package 402 to a second main surface 438 of the first package 402 opposite the first main surface 436. The at least one hole 408a may extend through the encapsulation 410.

As shown in FIGS. 4A to 4F, the at least one hole 408b may extend from a first main surface 436 of the first package 402 (through the encapsulation 410) to the carrier 428. However, it may also be envisioned that the at least one hole 408b may be a through hole that extends from the first main surface 436 of the first package 402 to the second main surface 438 of the first package 402. The carrier 428 may include a cavity that allows the through hole to pass through the carrier 428.

The at least one hole 408c may extend from the first main surface 436 of the first package 402 to the chip 426. The at least one hole 408c may also be a through hole that extends from the first main surface 436 of the first package 402 to the second main surface 438 of the first package 402. The chip 426 (and chip carrier 428) may include a cavity to allow the through hole to pass through. Alternatively or additionally, at least one hole 408c may extend from the first main surface 436 of the first package to the subsequent chip 434. The subsequent chip 434 (and chip carrier 428) may include a cavity that allows the through hole to pass through.

The first package 402 may include one or more of holes 408a, 408b, 408c or any other holes that is each configured to receive a contact terminal 406.

The package arrangement may also include a through hole package 404 including at least one contact terminal 406. The at least one contact terminal 406 may provide a solder contact 412. The at least one contact terminal 406 may be received in the at least one hole e.g. 408a, 408b, 408c. The received contact terminal 406 in hole 408b may be electrically coupled with the carrier 428. The received contact terminal 406 in hole 408b may be electrically coupled with the carrier via solder contact 412. In other words, the solder contact 412 may be provided between the at least one contact terminal 406 and a contact of the carrier 428. The received contact terminal 406 in hole 408c may be electrically coupled with one or more of the chip 426, the subsequent chip 434 and the carrier 428. The received contact terminal 406 in through hole 408c may be electrically coupled with one or more of the chip 426, the subsequent chip 434 and the carrier 428 via solder contact 412. In other words, the solder contact 412 may be provided between the at least one contact terminal 406 and a contact 440 (of the chip 426 or subsequent chip 434 or carrier 428). If the at least one hole e.g. 408a, 408b, 408c is a through hole, the at least one contact terminal 406 of the through hole package 404 may extend through the entire through hole from the first main side 436 of the first package 402 to the second main side 438 of the first package 402. The at least one contact terminal 406 may project from the second main side 438 of the first package 402.

The through hole package 404 may include a passive device. The passive device may be a capacitor as shown in FIG. 4C to FIG. 4F. The through hole package 404 may include, alternatively or additionally, inductors, diodes, resistors or any other passive devices. The through hole package may also include additional capacitors. The through hole package 404 may include an active device such as a logic integrated circuit, a memory integrated circuit or a power integrated circuit.

FIG. 5 is a schematic 500 showing a method to manufacture a package arrangement according to various embodiments. The method may include, in 502, providing a first package. The method may further include, in 504, providing a through hole package including at least one contact terminal. The method may also include, in 506, receiving the at least one contact terminal of the through hole package using at least one hole in an encapsulant of the first package, wherein the at least one contact terminal provides a solder contact.

Receiving the at least one contact terminal of the through hole package using at least one hole in an encapsulant of the first package may include bringing together the first package and the through hole package such that the through hole package is on the first package or the through hole package is over the first package. The through hole package and the first package may form a stacked arrangement. Receiving the at least one contact terminal of the through hole package using at least one hole in an encapsulant of the first package may include passing the at least one contact terminal of the through hole package into the at least one hole on the encapsulant of the first package. The through hole package may be over the first package when the through hole package is separated from the first package by one or more intermediate layers. The through hole package may also be separated from the first package by a carrier or a substrate.

The one or more intermediate layers or the substrate or the carrier may have through holes to allow the at least one contact terminal to pass through the substrate or carrier to the first package. Receiving the at least one contact terminal of the through hole package using at least one hole in the encapsulant of the package may include forming a stack arrangement.

The method of forming the first package may include an encapsulation process or a molding process. The encapsulation process or the molding process may include a film assisted process.

Forming the at least one hole may include etching the encapsulant. Etching may include reactive ion etching. Alternatively, forming the hole may be carried out during the encapsulation process or molding process. A masking structure may be arranged where the hole is to be formed. Encapsulation or molding may then be carried out. The masking structure may be removed after encapsulation or molding to form the hole. Forming the at least one hole may also include drilling such as laser drilling.

In various embodiments, the first package may include a surface mount package. The method may include mounting the first package on a surface of a substrate (e.g. a printed circuit board (PCB)). Mounting the first package onto the surface of the substrate may include soldering the first package to the surface.

In various other embodiments, the first package may include a through hole package. The first package may include a through hole package with bent pins. The bent pins may be configured for insertion into holes on a first surface of a substrate (e.g. a printed circuit board (PCB)). The holes may extend to a second surface of the substrate opposite the first surface. Mounting the first package on a substrate may include passing the pins through the holes to the second surface. The method may further include soldering the pins to electrically conductive pads.

The method may include bringing the first package and through hole package together to form a stack arrangement with the through hole package on or over the first package before mounting the first package onto the surface of the substrate. Alternatively, the first package may be mounted on the surface of the substrate, followed by arranging the through hole package on or over the first package.

The solder contact may include a solder connection or a solder ball. The method may also include melting a solder using an elevated temperature, applying the liquefied solder to the at least one contact terminal using a solder gun or any other suitable means and allowing the liquefied solder to solidify to form the solder contact.

The first package may include at least one chip and a contact. The solder contact may be provided between the at least one contact terminal and the contact. The contact may include an electrical contact. The at least one chip may include the contact. In other words, the contact may be a chip contact. Alternatively, the contact may be on a metallic carrier (e.g. a leadframe) in which the at least one chip is on. The method may include attaching the at least one chip to the metallic carrier having the contact.

The substrate may be a printed circuit board and mounting the first package to the substrate may include attaching the first package to the printed circuit board. The printed circuit board may include a board contact. In other words, the method may also include providing a printed circuit board including a board contact. The method may further include arranging the first substrate on or over the printed circuit board. The method may also include passing the at least one contact terminal of the through hole package into or through the at least one hole on the encapsulant of the first package. The method may also include electrical coupling (either directly or indirectly) the at least one contact terminal to the printed circuit board. Electrical coupling the at least one contact terminal to the printed circuit board may be via the solder contact. Electrical coupling between the at least one contact terminal and the board contact may be done via the solder contact. In other words, the solder contact may be between the at least one contact terminal and the board contact.

The at least one hole may expose the contact to electrically couple the at least one contact terminal of the through hole package. The method may include etching or drilling the encapsulant material to form cavities, followed by depositing conductive material to form interconnects between the contact and the at least one hole of first package. The at least one contact terminal may be electrically coupled to the contact when it is received in the at least one hole. Alternatively, the method may include forming the at least one hole through the encapsulant material above or near a contact of a chip or carrier or a further chip such that the at least one hole exposes the contact. The at least one contact terminal may be electrically coupled to the contact when it is received in the at least one hole.

In various embodiments, the at least one hole in the encapsulant may be a through hole extending from a first main side of the first package to a second main side of the first package opposite the first main side. The at least one contact terminal of the through hole package may extend through the entire through hole from the first main side of the first package to the second main side of the first package. The at least one contact terminal may project from the second main side of the first package. Forming the at least one through hole may include etching such as deep reactive ion etching. Forming the at least one through hole may include drilling such as laser drilling. Alternatively, the at least one through hole may be formed during encapsulation or molding process using a masking structure.

The first package may include an active device. The active device may be or may include an integrated circuit such as a logic integrated circuit, a memory integrated circuit or a power integrated circuit. The integrated circuit may be an application specific integrated circuit (ASIC) or a field programmable gate array (FPGA). The first package may include at least one chip which is or which includes the active device. The first package may include additional active devices or passive devices. The additional devices or passive devices may be electrically coupled to the active device. The additional devices or passive devices may be electrically coupled to the active device using electrical connections such as interconnects, metallization or wire bonds.

The through hole package may include a passive device. The passive device may be or may include a capacitor, an inductor, a diode or a resistor. The through hole package may, additionally or alternatively, include an active device. The active device may be or may include an integrated circuit such as a logic integrated circuit, a memory integrated circuit or a power integrated circuit. The integrated circuit may be an application specific integrated circuit (ASIC) or a field programmable gate array (FPGA).

In various embodiments, the active and/or passive device (s) in the through hole package may be configured to work with the active device(s) in the first package to perform a function. The device(s) in the through hole package and the device(s) in the first package may be different modules configured to work with one another. For instance, the through hole package may include a capacitor to store a logic state while the first package may include a logic circuit to read and write the logic state stored in the capacitor. In another instance, the through hole package may include a filter and the first package may include a low noise amplifier configured to work with the filter.

In various embodiments, a passive device may include entirely of passive components. On the other hand, an active device may include at least one active component. A passive component may be a component that is by itself, incapable of power gain. In contrast, an active component may be a component that is by itself, capable of power gain. Passive components may include capacitors, inductors, resistors, diodes etc. Active components may include transistors, e.g. logic transistors or power transistors (e.g. power metal oxide field effect transistors (power MOSFETs), or power bipolar transistors, or insulated gate bipolar transistors (IGBTs), vacuum tubes, relays, tunnel diodes or glow tubes.

In various embodiments, a sleeve may be provided in the at least one hole of the first package. The sleeve may be configured to strengthen the received at least one contact terminal in the at least one hole. In other words, the sleeve may be configured to mechanical strength of the received at least one contact terminal. In various embodiments, the sleeve may be electrically coupled to the at least one contact terminal via the solder contact. The sleeve may be soldered to the at least one contact terminal using the solder contact. The sleeve may be provided in the at least one hole of the first package during the encapsulation or molding process. The at least one contact terminal may then make contact with the sleeve when the at least one contact terminal is received in the at least one hole. Alternatively, the sleeve may be soldered to the at least one contact terminal and inserted into the at least one hole.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A package arrangement, comprising:
    a first package;
    a through hole package comprising at least one contact terminal;
    wherein the first package comprises at least one hole in an encapsulant to receive the at least one contact terminal of the through hole package; and
    a solder contact on the received at least one contact terminal;
    wherein the at least one hole in the encapsulant is a through hole extending from a first main side of the first package to a second main side of the first package opposite the first main side;
    wherein the at least one contact terminal of the through hole package extends through the entire through hole from the first main side of the first package to the second main side of the first package and projects from the second main side of the first package.

2. The package arrangement of claim 1,
    wherein the first package comprises a surface mount device package.

3. The package arrangement of claim 1,
    wherein the first package comprises a through hole package with bent pins.

4. The package arrangement of claim 1, further comprising:
    a printed circuit board comprising a board contact;
    wherein the solder contact is provided between the at least one contact terminal and the board contact.

5. The package arrangement of claim 1,
    wherein the first package comprises an active device.

6. The package arrangement of claim 1,
    wherein the through hole package comprises a passive device.

7. The package arrangement of claim 1,
    wherein the through hole package comprises an active device.

8. A method to manufacture a package arrangement, the method comprising:
    providing a first package;
    providing a through hole package including at least one contact terminal;
    at least partially introducing the at least one contact terminal of the through hole package into at least one hole in an encapsulant of the first package;
    forming a solder contact on the at least one contact terminal of the through hole package,
    wherein the at least one hole in the encapsulant is a through hole extending from a first main side of the first package to a second main side of the first package opposite the first main side;
    wherein the at least one contact terminal of the through hole package extends through the entire through hole from the first main side of the first package to the second main side of the first package and projects from the second main side of the first package.

9. The method according to claim 8,
    wherein the first package comprises a surface mount device package.

10. The method according to claim 8,
    wherein the first package comprises a through hole package with bent pins.

11. The method according to claim 8, the method further comprising:
   providing a printed circuit board comprising a board contact; and
   arranging the first package on the printed circuit board;
   wherein the solder contact is formed between the at least one contact terminal and the board contact.

12. The method according to claim 8,
   wherein the first package comprises an active device.

13. The method according to claim 8,
   wherein the through hole package comprises a passive device.

14. The method according to claim 8,
   wherein the through hole package comprises an active device.

15. The method according to claim 8,
   wherein a sleeve is provided in the at least one hole of the first package.

\* \* \* \* \*